United States Patent
Maier et al.

(10) Patent No.: US 7,138,800 B1
(45) Date of Patent: Nov. 21, 2006

(54) METHOD AND APPARATUS FOR VIBRATION-RELATED ARTIFACT REDUCTION

(75) Inventors: Joseph K. Maier, Milwaukee, WI (US); Ajeetkumar Gaddipati, Waukesha, WI (US); Michael J. Radziun, Waterford, WI (US); Robert Donald Peters, Sussex, WI (US)

(73) Assignee: General Electric Company, Schenectady, NY (US)

( * ) Notice: Subject to any disclaimer, the term of this patent is extended or adjusted under 35 U.S.C. 154(b) by 0 days.

(21) Appl. No.: 11/275,286

(22) Filed: Dec. 21, 2005

(51) Int. Cl.
*G01V 3/00* (2006.01)
(52) U.S. Cl. ............................. 324/309; 324/318
(58) Field of Classification Search ................ 324/309, 324/307, 318, 319, 322, 300; 600/410, 412, 600/413, 420, 422
See application file for complete search history.

(56) References Cited

U.S. PATENT DOCUMENTS 5,706,813 A * 1/1998 Filler et al. ................. 600/422
6,600,316 B1 * 7/2003 Chen et al. ................. 324/303

* cited by examiner

*Primary Examiner*—Brij B. Shrivastav
(74) *Attorney, Agent, or Firm*—Ziolkowski Patent Solutions Group, SC; Michael A. Della Penna; Carl B. Horton (57) ABSTRACT

A method and apparatus for reducing vibration-related artifacts in diffusion weighted imaging determines a vibrational frequency of an MR system and modifies scan parameters such that vibrational frequencies induced on the MR system are inconsistent with the vibrational frequency of the MR system. The method and apparatus improves image quality of MR images acquired using diffusion weighted imaging techniques with the MR system. As such, modification and/or redesign of the MR system to reduce vibrational frequency interaction is reduced.

23 Claims, 11 Drawing Sheets

METHOD AND APPARATUS FOR VIBRATION-RELATED ARTIFACT REDUCTION

BACKGROUND OF THE INVENTION

The present invention relates generally to magnetic resonance (MR) imaging and, more particularly, to reducing vibration-related artifacts in diffusion weighted MR imaging.

When a substance such as human tissue is subjected to a uniform magnetic field (polarizing field $B_0$), the individual magnetic moments of the spins in the tissue attempt to align with this polarizing field, but precess about it in random order at their characteristic Larmor frequency. If the substance, or tissue, is subjected to a magnetic field (excitation field $B_1$) which is in the x-y plane and which is near the Larmor frequency, the net aligned moment, or "longitudinal magnetization", $M_Z$, may be rotated, or "tipped", into the x-y plane to produce a net transverse magnetic moment $M_t$. A signal is emitted by the excited spins after the excitation signal $B_1$ is terminated and this signal may be received and processed to form an image.

When utilizing these signals to produce images, magnetic field gradients ($G_x$, $G_y$, and $G_z$) are employed. Typically, the region to be imaged is scanned by a sequence of measurement cycles in which these gradients vary according to the particular localization method being used. The resulting set of received NMR signals are digitized and processed to reconstruct the image using one of many well known reconstruction techniques.

As described above, magnetic field gradients are applied in MR imaging to encode spins in an object. It is desirable that the spatial frequency coordinates, i.e., k-space coordinates $k_x$, $k_y$, in cycles/cm, of raw data samples acquired during MR imaging be controlled solely via the integrals of the applied encoding gradients. Ideally, these gradients impart directional and linear phase dispersion to the spins inside the object. The raw data's peak occurs at the point where minimal phase dispersion occurs across the object, i.e., when the integrals of the applied gradients go to zero. The gradient waveforms and analog-to-digital conversion are typically synchronized such that the raw data peak location is known with respect to the raw data matrix dimensions.

However, a number of undesirable mechanisms can cause shifts where the peak occurs within the raw data matrix. For example, gradient amplifier infidelity, gradient pulse induced eddy current fields, gradient channel group delays, and pulse sequence database timing errors can cause such shifts. Another undesirable mechanism causes residual phase dispersion across the object where object motion occurs during the application of the gradients. When undesirable mechanisms motion occurs, the phase "unwinding" imparted by a later gradient pulse does not align spatially inside the object with the previous phase "wind up" imparted by an earlier gradient pulse.

The subsequent shift in the raw data peak can be problematic in MR imaging methods where the raw data sampling is stopped or truncated near to the ideal assumed position of the peak and, in particular, diffusion weighted sequences. For example, "fractional $k_y$" Diffusion Weighted Echo Planar Imaging (DWEPI) may be affected where the $k_y$ sampling may be terminated as close as 16 rows below $k_y=0$. Another diffusion weighted technique is Diffusion Weighted Periodically Rotated Overlapping Parallel Line with Enhanced Reconstruction (DW-PROPELLER), and it can be particularly sensitive to k-space center shifts because the blade height, i.e., minor axis direction, is typically 8, leaving only 4 samples above and below the ideal peak. In this manner, the k-space peak does not have to shift far from the blade center along the minor axis before significant low spatial frequency data is lost, i.e., never taken.

The MR imaging methods of DWEPI and DW-PROPELLER typically use two high amplitude, long diffusion sensitizing gradient pulses to attenuate the signal from tissue diffusing along the applied DW gradient. These pulses make the DW sequences particularly sensitive to object motion induced k-space center shifts since the first diffusion pulse imparts a large phase shift (cycles/cm) across the object before the second one "removes" the phase shift, all under the assumption that the object has not moved during the diffusion pulse pair.

The direction and extent of object motion with respect to the applied diffusion gradient direction affects the extent of resulting k-space shifts. Rotational object motion about an axis "A" during application of diffusion pulses on another perpendicular axis "B" can result in an undesirable linear phase dispersion error along axis "B" and the remaining orthogonal axis "C". If axis "B" and/or "C" happen to be image plane encoding axes, i.e., phase or frequency, k-space center shifts can occur. Rotational motion occurring about a physical z (object S/I) axis with DW gradients on physical X (object R/L) axis is problematic for DW-PROPELLER imaging, and shifts along Kminor ($k_y$) are problematic for DWEPI. Object motion can be object derived voluntary/involuntary motion and/or scanner driven involuntary object motion caused by movement or vibration of mechanical components supporting the object such as a head coil, table, etc. Gradient pulse induced forces exerted on the gradient coil assembly can lead to involuntary object motion, which can cause artifacts in DWEPI and DW-PROPELLER imaging.

It would therefore be desirable to have a method and apparatus capable of reducing motion artifacts caused by scanner-induced involuntary object motion.

BRIEF DESCRIPTION OF THE INVENTION

The present invention provides a method and apparatus of reducing vibration-related artifacts that overcome the aforementioned drawbacks. In this regard, the present invention includes a technique modeling vibrational forces induced with a diffusion gradient pulse sequence on an MR system. The polarities of the gradient pulses in the diffusion gradient pulse sequence are determined to avoid induced vibrational frequencies coincident with inherent mechanical resonant vibrational frequencies of the MR system.

In accordance with one aspect of the invention, an MR apparatus includes an MR system having a plurality of gradient coils positioned about a bore of a magnet to impress a polarizing magnetic field. An RF transceiver system and an RF switch are controlled by a pulse module to transmit and receive RF signals to and from an RF coil assembly to acquire MR images. The MR apparatus also includes a computer programmed to determine a mechanical resonant frequency of the MR system and acquire diffusion weighted MR data such that vibration harmonics generated during application of diffusion weighted gradients to acquire the diffusion weighted MR data do not coincide with the mechanical resonant frequency of the MR system.

In accordance with another embodiment, a method of MR imaging includes the step of determining a plurality of diffusion gradient pulse sequences, each diffusion gradient pulse sequence having a plurality of diffusion weighted gradient pulses. The method also includes the steps of modeling each of the plurality of diffusion gradient pulse sequences with a distinct gradient amplitude and polarity versus time function having a polarity marker for the plurality of diffusion weighted gradient pulses and generating a temporal frequency spectrum of vibrational forces induced with each of the modeled plurality of diffusion gradient pulse sequences. The method further includes selecting a modeled diffusion gradient pulse sequence from the plurality of modeled diffusion gradient pulse sequences having a temporal frequency spectrum dissimilar from a mechanical resonance frequency spectrum of an MR system and applying the selected modeled diffusion gradient pulse sequence in an MR scan.

In accordance with another aspect of the invention, the invention is embodied in a computer program stored on a computer readable storage medium and having instructions which, when executed by a computer, cause the computer to determine a mechanical resonant (vibrational) frequency of an MR apparatus and determine a series of diffusion gradient pulse polarity schemes for diffusion weighted gradients to be applied by gradient coils of the MR apparatus. A frequency spectrum is calculated of vibrational forces induced for each of the diffusion gradient pulse polarity schemes. The instructions further cause the computer to identify a frequency spectrum having at least one spectral peak at a frequency inconsistent with the mechanical vibration frequency of the MR apparatus and perform a diffusion weighted MR scan of an imaging subject with application of diffusion weighted gradients being governed by the diffusion gradient pulse polarity scheme corresponding to the identified frequency spectrum.

In accordance with yet another aspect of the invention, a method of MR imaging includes the steps of measuring a mechanical resonant frequency of an MR scanner and determining a range of parameters whose corresponding pulse sequence has a gradient sequence that excites the mechanical resonant frequencies of the MR scanner during an MR scan. The use of the MR scanner is limited based on the determined range of parameters.

Various other features and advantages of the present invention will be made apparent from the following detailed description and the drawings.

BRIEF DESCRIPTION OF THE DRAWINGS

The drawings illustrate one preferred embodiment presently contemplated for carrying out the invention.

In the drawings.

DETAILED DESCRIPTION OF THE PREFERRED EMBODIMENT

Figure 1:
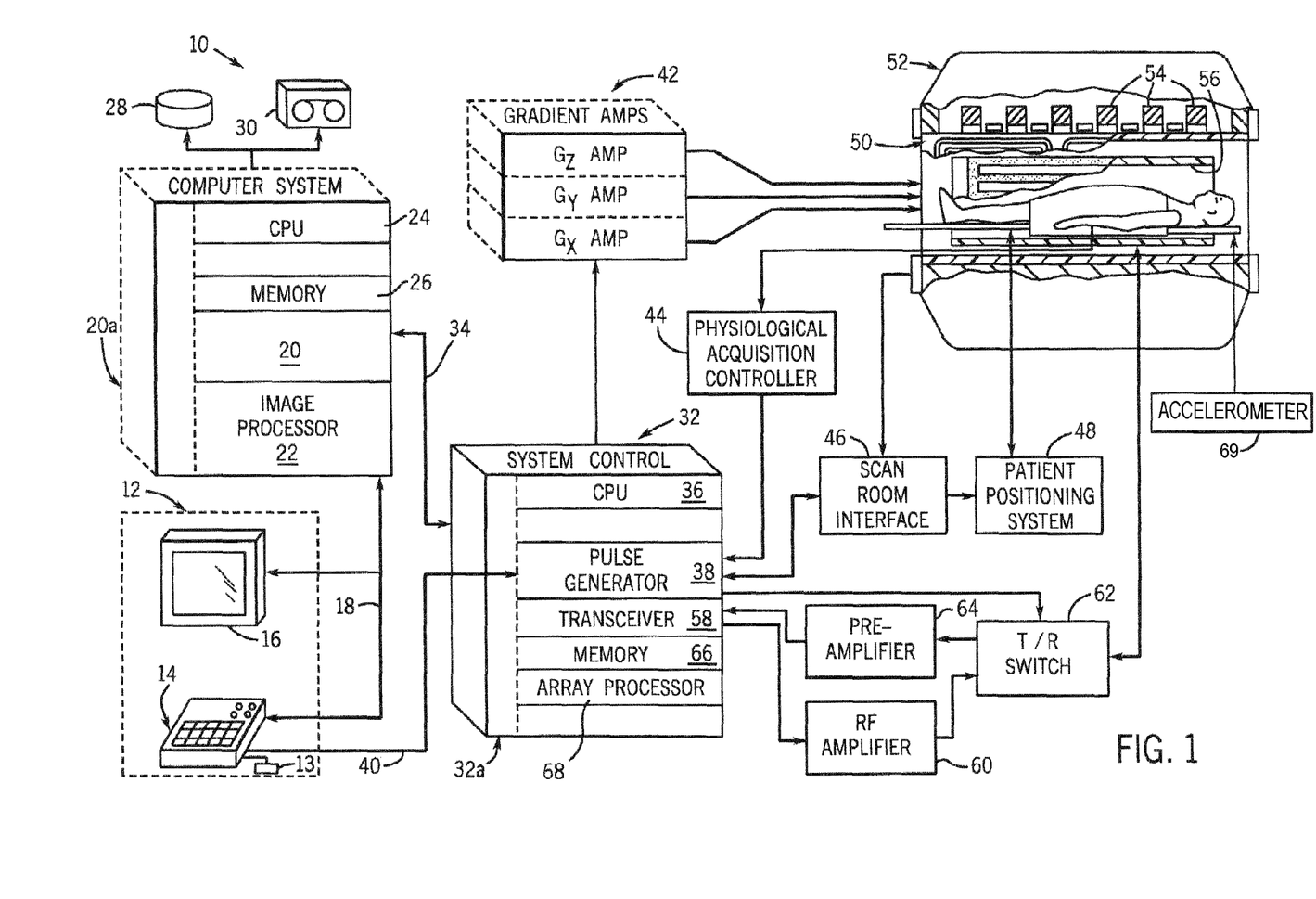
FIG. 1 is a schematic block diagram of an MR imaging system for use with the present invention.

Referring to FIG. 1, the major components of a preferred MR system 10 incorporating the present invention are shown. The operation of the system is controlled from an operator console 12 which includes a keyboard or other input device 13, a control panel 14, and a display screen 16. The console 12 communicates through a link 18 with a separate computer system 20 that enables an operator to control the production and display of images on the display screen 16. The computer system 20 includes a number of modules which communicate with each other through a backplane 20a. These include an image processor module 22, a CPU module 24 and a memory module 26, known in the art as a frame buffer for storing image data arrays. The computer system 20 is linked to disk storage 28 and tape drive 30 or other storage medium for storage of image data and programs, and communicates with a separate system control 32 through a high speed serial link 34. The input device 13 can include a mouse, joystick, keyboard, track ball, touch activated screen, light wand, voice control, or any similar or equivalent input device, and may be used for interactive geometry prescription.

The system control 32 includes a set of modules connected together by a backplane 32a. These include a CPU module 36 and a pulse generator module 38 which connects to the operator console 12 through a serial link 40. It is through link 40 that the system control 32 receives commands from the operator to indicate the scan sequence that is to be performed. The pulse generator module 38 operates the system components to carry out the desired scan sequence and produces data which indicates the timing, strength and shape of the RF pulses produced, and the timing and length of the data acquisition window. The pulse generator module 38 connects to a set of gradient amplifiers 42, to indicate the timing and shape of the gradient pulses that are produced during the scan. The pulse generator module 38 can also receive object data, i.e., of an object, from a physiological acquisition controller 44 that receives signals from a number of different sensors connected to the object, such as ECG signals from electrodes attached to the object. And finally, the pulse generator module 38 connects to a scan room interface circuit 46 which receives signals from various sensors associated with the condition of the object and the magnet system. It is also through the scan room interface circuit 46 that an object positioning system 48 receives commands to move the object to the desired position for the scan.

The gradient waveforms produced by the pulse generator module 38 are applied to the gradient amplifier system 42 having Gx, Gy, and Gz amplifiers. Each gradient amplifier excites a corresponding physical gradient coil in a gradient coil assembly generally designated 50 to produce the magnetic field gradients used for spatially encoding acquired signals. The gradient coil assembly 50 forms part of a magnet assembly 52 which includes a polarizing magnet 54 and a whole-body RF coil 56. A transceiver module 58 in the system control 32 produces pulses which are amplified by an RF amplifier 60 and coupled to the RF coil 56 by a transmit/receive switch 62. The resulting signals emitted by the excited nuclei in the object may be sensed by the same RF coil 56 and coupled through the transmit/receive switch 62 to a preamplifier 64. The amplified MR signals are demodulated, filtered, and digitized in the receiver section of the transceiver 58. The transmit/receive switch 62 is controlled by a signal from the pulse generator module 38 to electrically connect the RF amplifier 60 to the coil 56 during the transmit mode and to connect the preamplifier 64 to the coil 56 during the receive mode. The transmit/receive switch 62 can also enable a separate RF coil (for example, a surface coil) to be used in either the transmit or receive mode.

The MR signals picked up by the RF coil 56 are digitized by the transceiver module 58 and transferred to a memory module 66 in the system control 32. A scan is complete when an array of raw k-space data has been acquired in the memory module 66. This raw k-space data is rearranged into separate k-space data arrays for each image to be reconstructed, and each of these is input to an array processor 68 which operates to Fourier transform the data into an array of image data. This image data is conveyed through the serial link 34 to the computer system 20 where it is stored in memory, such as disk storage 28. In response to commands received from the operator console 12, this image data may be archived in long term storage, such as on the tape drive 30, or it may be further processed by the image processor 22 and conveyed to the operator console 12 and presented on the display 16.

The MR system 10 can induce involuntary object motion during operation due to application of current through components thereof. For example, the application of pulses in the gradient coil assembly 50 and the RF coil 56 exerts vibrational forces on the MR system 10. Operational vibration forces of the MR system 10 may be determined by attaching an accelerometer 69 thereto and recording the results. The results may be stored in a lookup table for a particular MR system or for a class of MR systems. The results may also be measured in real-time. A frequency analysis of the MR system 10 may be determined thereby that indicates the vibrational frequencies of the MR system 10. In particular, the frequency analysis may indicate a peak frequency in which an object is most subject to involuntary motion.

The present invention is directed to a method of reducing vibration-related artifacts that can be carried out on the MR apparatus of FIG. 1, or equivalents thereof. As will be described, the invention is effective in reducing involuntary object motion induced by vibrational forces exerted during application of diffusion gradient pulses. In this regard, the present invention improves image quality and, as such, is believed to be effective in reducing the number of repeat scans that are required of a subject.

Figure 2:
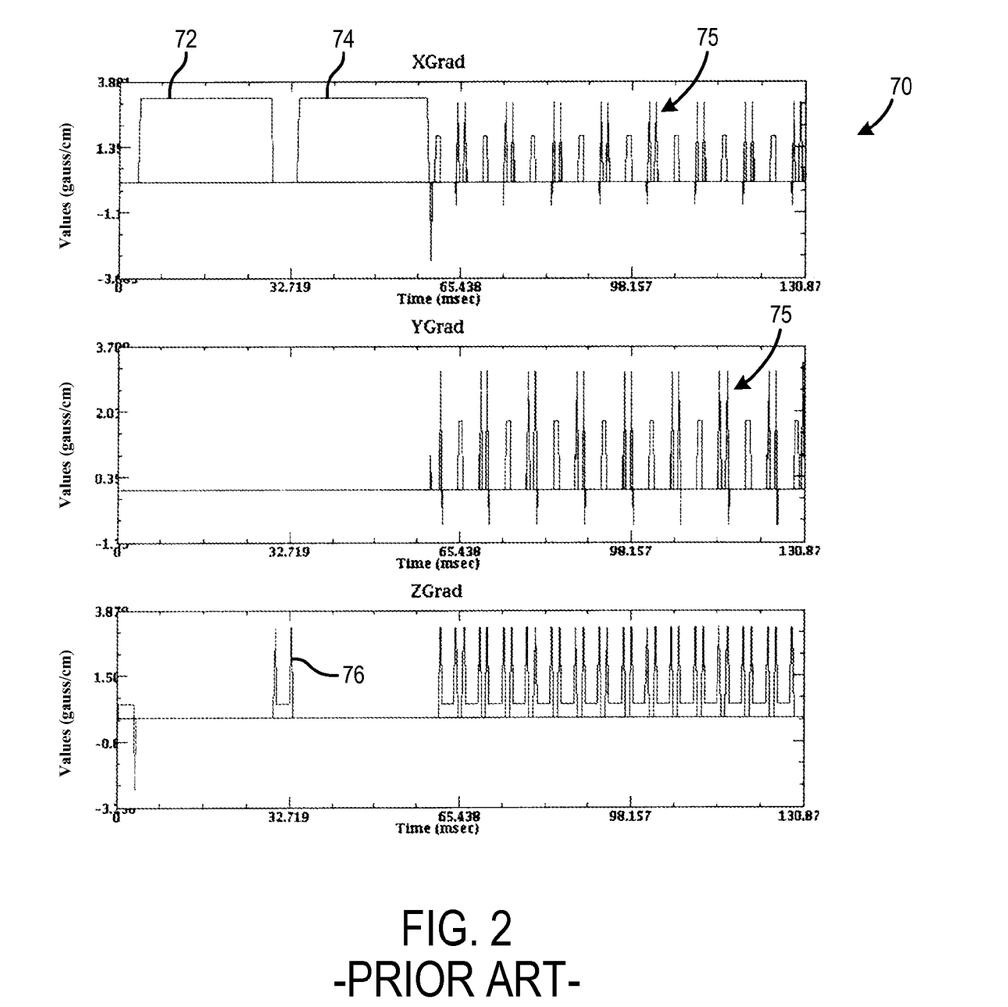
FIG. 2 is a portion of a known Single Spin Echo (SSE) DW-PROPELLER pulse sequence to acquire diffusion weighted MR images.

Referring now to FIG. 2, a portion of an exemplary known Single Spin Echo (SSE) DW-PROPELLER pulse sequence to acquire diffusion weighted MR images is shown. A diffusion gradient pulse sequence 70 includes two diffusion gradient pulses 72, 74. In a preferred embodiment, pulse 72 is applied before a slice selective pulse 76, and pulse 74 is applied after the slice selective pulse 76. As shown, diffusion gradient pulses 72, 74 are applied along an x axis for each image slice; however, it is contemplated that diffusion gradient pulses 72, 74 may be similarly applied along other axes, such as a y axis or a z axis. For example, the pulses 75 rotate between the x and y gradients to get the different "blades" to rotate, while the diffusion sensitizing pulse pair 72, 74 remains along the x direction. As shown in FIG. 2, pulses 72, 74 each have a positive polarity. That is, the direction of current passing through the gradient coil assembly 50 of FIG. 1 during application of pulses 72, 74 is positive. However, in some diffusion weighted sequences, the polarity of pulses 72, 74 may be negative. Whether positive or negative, both pulses 72, 74 of known diffusion weighted pulse sequences have the same polarity.

Application of pulses 72, 74 induces vibrational forces on the gradient coil assembly 50 of the MR system 10. Reduction of vibrational frequencies according to the present invention includes determining characteristic resonant vibrational frequencies of the MR system 10 and determining the driver or "applied hammer" frequency characteristic applied to the gradient coil assembly 50 by a particular gradient sequence. In this manner, driver vibrational frequencies of the gradient coil assembly 50 may be compared with the resonant vibrational frequencies of the MR system 10 to find inconsistent peak frequencies therebetween. As will be shown, the driver vibrational frequencies of the gradient coil assembly 50 vary according to the polarity scheme of the diffusion gradient pulses 72, 74 applied thereto.

Figure 3:
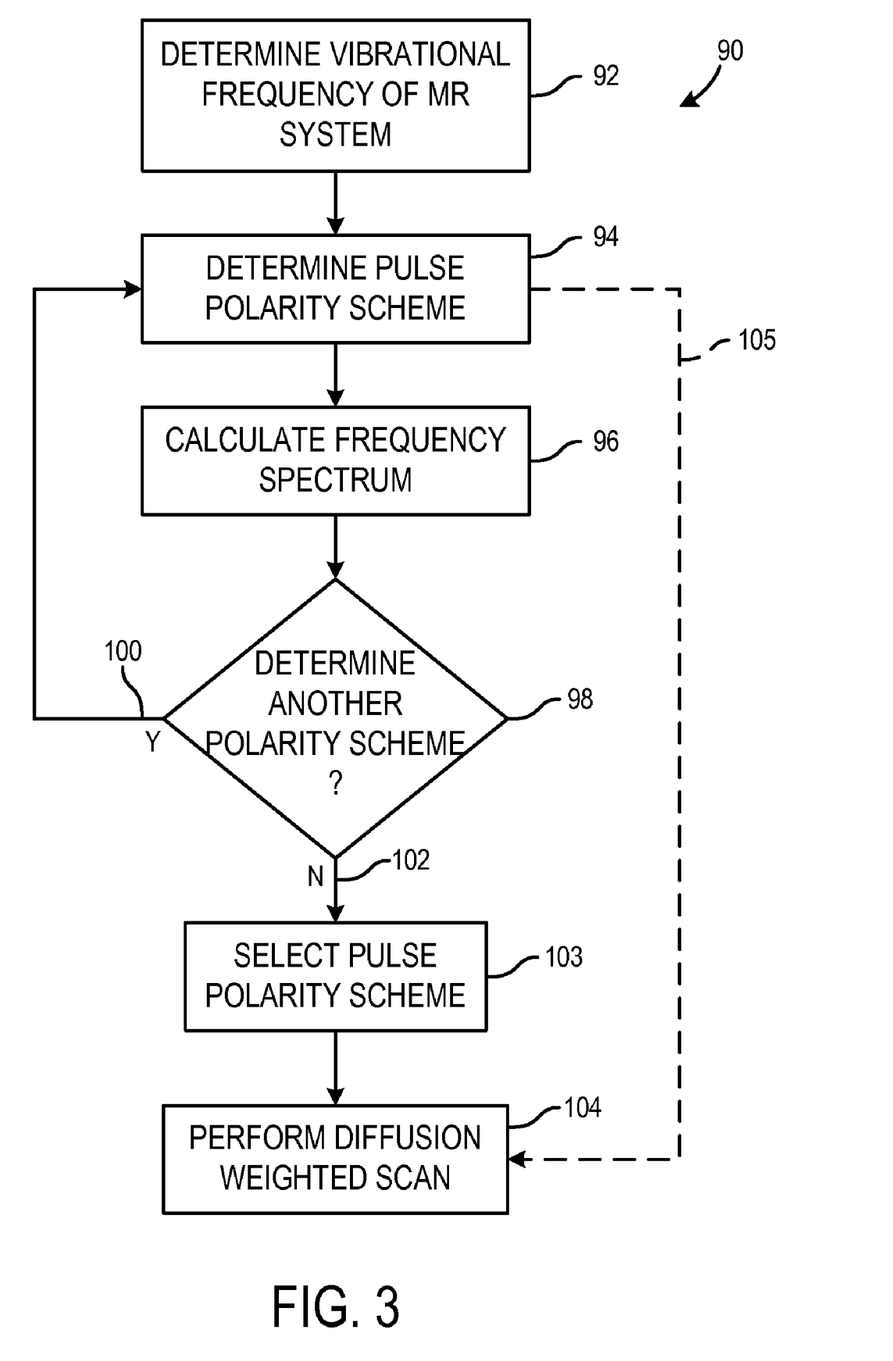
FIG. 3 is a technique for reducing vibration-related artifacts according to the present invention.

FIG. 3 shows a vibration-related artifact reducing technique according to the present invention. Technique 90 begins at step 92 by determining a peak vibrational frequency of an MR system 10 without application of diffusion gradients. In a preferred embodiment, the peak vibrational frequency is determined by real-time measurement, or, alternatively, by setting the vibrational frequency equal to a predetermined value such as 10 Hz, for example. Alternatively, the predetermined value may be acquired from a lookup table specific to the MR system 10 or related to the class of MR systems to which the MR system 10 belongs. Next, a pulse polarity scheme is determined at step 94. The pulse polarity scheme establishes the polarities for diffusion weighted gradient pulses in a diffusion gradient pulse sequence. In a preferred embodiment, the pulse polarity scheme is a gradient amplitude versus time function for a diffusion gradient pulse sequence over a 2*TR interval. However, the pulse polarity scheme may be determined for any number of TR intervals. After the pulse polarity scheme is determined 94, a frequency spectrum is calculated for the pulse polarity scheme at step 96. A Fourier transform is applied to the pulse polarity scheme to obtain a magnitude versus frequency spectrum. That is, the Fourier transform calculates vibrational frequencies of the vibrational forces induced with the gradient coil assembly 50 by application of the diffusion gradient pulses of the pulse polarity scheme therewith. Exemplary pulse polarity schemes and corresponding frequency spectra are described below.

Technique 90 next determines whether to determine another polarity scheme and corresponding frequency spectrum at step 98. If so 98, 100, technique 90 returns to step 94 and the process proceeds as described above to determine a different pulse polarity scheme. If not 98, 102, the frequency spectrum having peak frequencies at frequencies inconsistent with the peak frequency of the MR system 10 is selected. In a preferred embodiment, the determined frequency spectrum has peak frequencies least coincident with the peak frequency of the MR system 10. In this manner, vibrational forces induced with the gradient coil apparatus 50 that may coincide with the natural resonant frequencies of the MR system 10 are reduced. Next, at step 103, the pulse polarity scheme corresponding to the determined frequency spectrum is selected and a diffusion weighted scan is performed at step 104 that incorporates the diffusion gradient pulse polarity scheme. For example, the diffusion weighted scan may be a DWEPI scan or a DW-PROPELLER scan. It is contemplated that a computer, i.e., the computer system 20 of FIG. 1, may be programmed to perform the steps of technique 90. In particular, the computer may be programmed to automatically determine the frequency spectrum and automatically select the pulse polarity scheme corresponding to the automatically determined frequency spectrum for the pending scan. Alternatively, the computer may be programmed to display the frequency spectrum and receive a user input from an operator indicating a desired selected frequency spectrum and/or pulse polarity scheme for the impending scan.

The peak vibrational frequency of the MR system 10 may vary for each installation of the MR system 10. That is, an MR system 10 installed at a first site may have a different peak vibrational frequency than a similar MR system installed at a second site. Furthermore, object weight may alter the peak vibrational frequency of the MR system. As such, if the peak vibrational frequency of a system at a particular site is known, the pulse polarity scheme may be site dependent and tailored for the MR system vibrational frequency. Furthermore, if a particular pulse polarity scheme is determined to be more effective compared with other pulse polarity schemes in reducing artifacts and ghosting for the MR system, the particular pulse polarity scheme so determined may be used as a default pulse polarity scheme for all diffusion weighted scans performed on the given MR system. As such, process flow 105 may direct technique 90 to perform the diffusion weighted scan that incorporates the particular pulse polarity scheme 104 after determining the particular pulse polarity scheme 94. Alternatively, the pulse polarity scheme may be site independent where a default, or predetermined, MR system vibrational frequency is used. The default vibrational frequency may be found, for example, based on an average of known vibrational frequencies for a class of MR systems. Similarly, the pulse polarity scheme for a particular site may be made object dependent upon determining changes in the MR system peak vibrational frequency due to object weight on a per scan basis.

FIGS. 4–13 show exemplary pulse polarity schemes and corresponding SSE pulse sequence frequency spectra corresponding thereto according to aspects of the present invention.

A series of polarity designators 106 is determined for a 2*TR interval. The 2*TR interval includes a $TR_1$ interval and a $TR_2$ interval. Each polarity designator 106 represents a polarity of a pair of diffusion gradient pulses, such as pulses 72, 74 of FIG. 2, for each slice of a multi-slice imaging scan. The polarity designator 106 represents the polarity of the pair of diffusion gradient pulses that will be applied during each slice of the multi-slice imaging scan. That is, the polarity of the pair of diffusion gradient pulses may be positive or negative A blade of MR data for a multi-blade imaging scan is acquired in each TR interval. Initially, the polarity of each polarity designator in the pulse polarity scheme is set to a positive polarity or a negative polarity. Next, the polarity of each polarity designator may be inverted, or "chopped", to an opposite polarity according to an inversion sequence to form the pulse polarity scheme.

Figure 4:
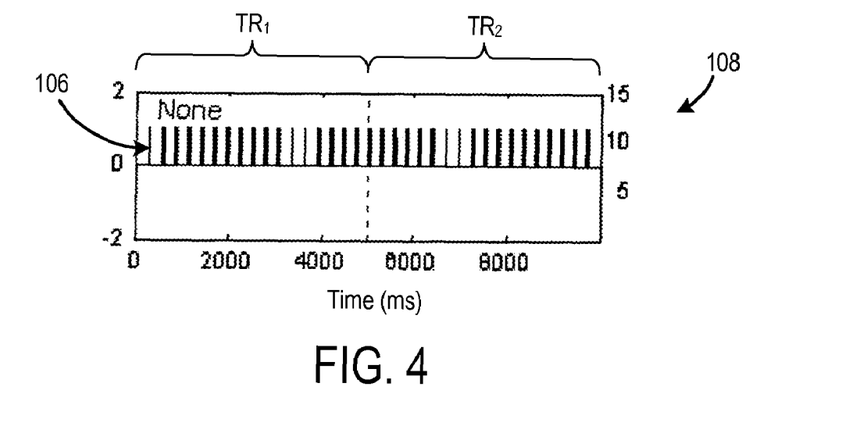
FIG. 4 is a gradient pulse polarity scheme for use in the technique of FIG. 3 in accordance with one aspect of the invention.

FIG. 4 shows a pulse polarity scheme 108 having the inversion sequence set to "None". That is, the "None" inversion sequence does not invert the polarity of any polarity designator 106.

Figure 5:
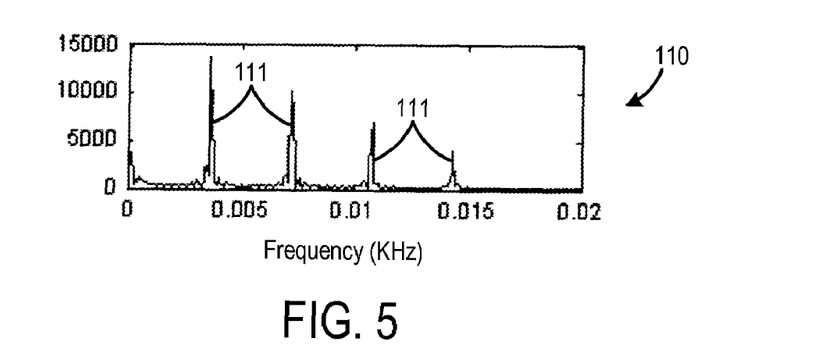
FIG. 5 is a frequency spectrum corresponding to a Fourier transform of the gradient pulse polarity scheme of FIG. 4 applied to SSE diffusion gradients.

FIG. 5. shows a frequency spectrum 110 corresponding to a Fourier transform of the pulse polarity scheme 108 of FIG. 4 applied to SSE diffusion gradients. Frequency spectrum 110 shows calculated vibrational frequencies induced with an exemplary gradient coil assembly having diffusion gradient pulses according to the pulse polarity scheme 108 applied thereto. As shown, frequency spectrum 110 shows peak frequencies 111 offset from 10 Hz.

Figure 6:
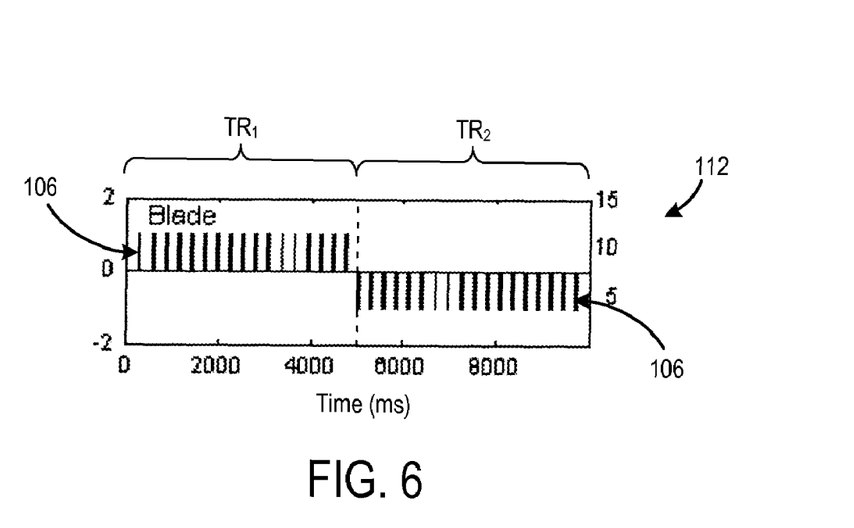
FIG. 6 is a gradient pulse polarity scheme for use in the technique of FIG. 3 in accordance with another aspect of the invention.

FIG. 6 shows a pulse polarity scheme 112 having the inversion sequence set to "Blade". In the "Blade" inversion sequence, the polarities of the polarity designators 106 in the first "M" blades are not inverted. Thereafter, the polarities of the polarity designators 106 in the next "M" blades are inverted. The inversion sequence is repeated such that every other group of "M" blades includes inverted polarity designators 106. As shown in FIG. 6, the polarity of the polarity designators 106 in one blade is not inverted, for example, in the $TR_1$ interval, while the polarity of the polarity designators 106 in the next TR are inverted. In this manner, "M" is set to 1. That is, the polarity of the polarity designators 106 in every other blade is inverted. As such, a multi-blade imaging scan according to pulse polarity scheme 112 includes application of diffusion gradient pulses for a first blade having a positive polarity and application of diffusion gradient pulses for a second blade having a negative polarity.

Figure 7:
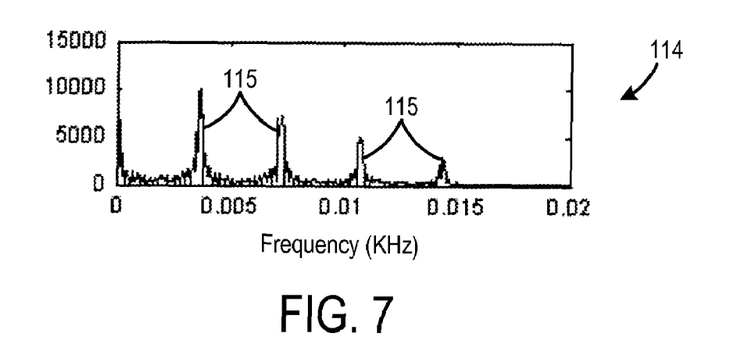
FIG. 7 is a frequency spectrum corresponding to a Fourier transform of the gradient pulse polarity scheme of FIG. 6 applied to SSE diffusion gradients.

FIG. 7 shows a frequency spectrum 114 corresponding to a Fourier transform of the pulse polarity scheme 112 of FIG. 6 applied to SSE diffusion gradients. Frequency spectrum 114 shows calculated vibrational frequencies induced with an exemplary gradient coil assembly having SSE diffusion gradient pulses according to the pulse polarity scheme 112 applied thereto. Peak frequencies 115 non-coincident with 10 Hz are illustrated.

Figure 8:
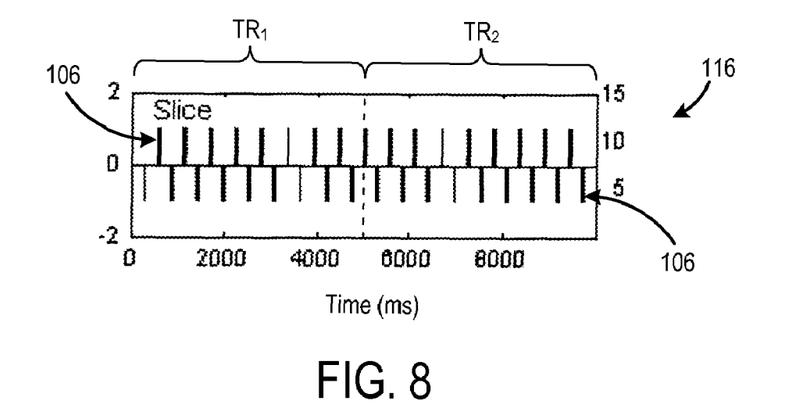
FIG. 8 is a gradient pulse polarity scheme for use in the technique of FIG. 3 in accordance with a further aspect of the invention.

FIG. 8 shows a pulse polarity scheme 1116 having the inversion sequence set to "Slice". In the "Slice" inversion sequence, the polarities of the first "N" polarity designators 106 are not inverted. Thereafter, the polarities of the next "N" polarity designators 106 are inverted. The inversion sequence is repeated such that every other group of "N" slices in the blade is inverted. The "Slice" inversion sequence repeats the inversion sequence as described in the succeeding blade. As shown in FIG. 8, "N" is set to 1. That is, the polarity of the polarity designator 106 of every other slice is inverted. Preferably, the value of "N" is an integer between zero and the total number of slices in the blade. Setting "N" equal to 0, for example, results in an inversion sequence identical to the "None" inversion sequence of FIG. 4. Similarly, setting "N" equal to 18, for example, results in an inversion sequence identical to the "Blade" inversion sequence of FIG. 6.

Figure 9:
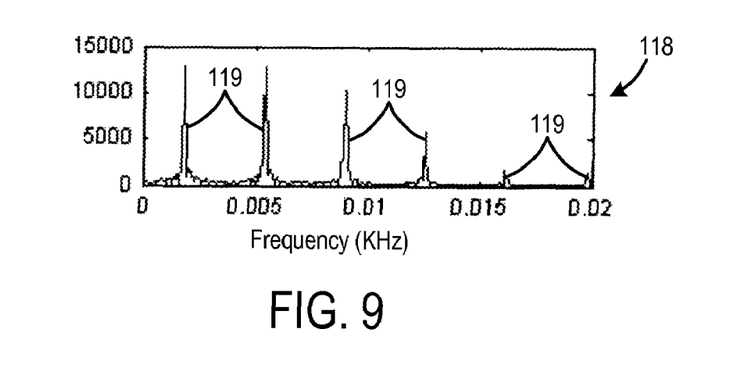
FIG. 9 is a frequency spectrum corresponding to a Fourier transform of the gradient pulse polarity scheme of FIG. 8 applied to SSE diffusion gradients.

FIG. 9 shows a frequency spectrum 118 corresponding to a Fourier transform of the pulse polarity scheme 116 of FIG. 8 applied to SSE diffusion gradients. Frequency spectrum 118 shows calculated vibrational frequencies induced with an exemplary gradient coil assembly having SSE diffusion gradient pulses according to the pulse polarity scheme 116 applied thereto. Frequency spectrum 118 shows harmonic peaks 119 inconsistent with 10 Hz.

Figure 10:
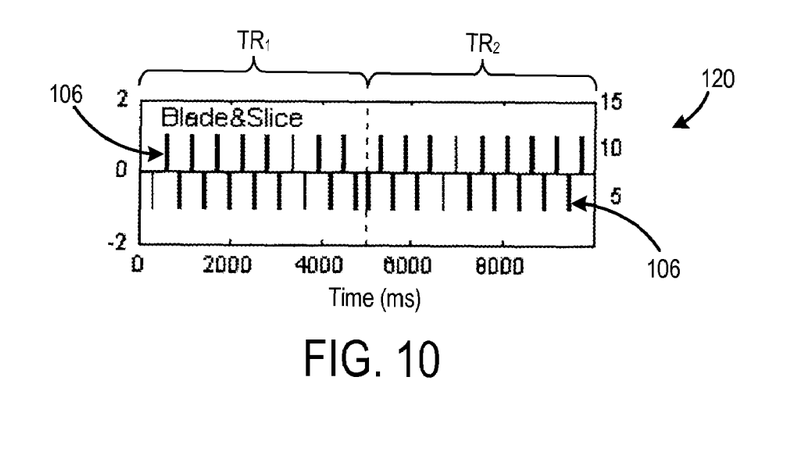
FIG. 10 is a gradient pulse polarity scheme for use in the technique of FIG. 3 in accordance with another aspect of the invention.

FIG. 10 shows a pulse polarity scheme 120 having the inversion sequence set to "Slice and Blade". In the "Slice and Blade" inversion sequence, the polarities of the polarity designators 106 are set according to the "Slice" inversion sequence as previously described. Then, the polarities of the polarity designators 106 in one of the blades are inverted.

Figure 11:
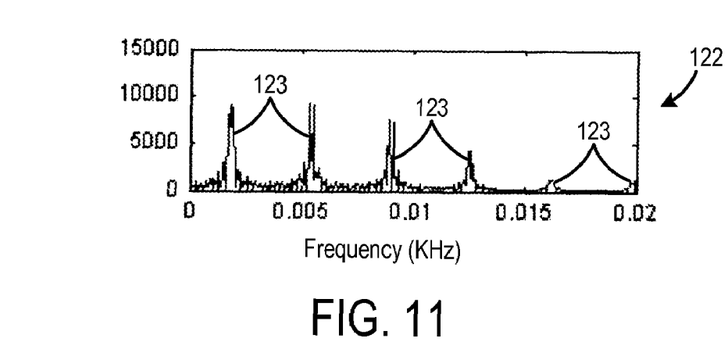
FIG. 11 is a frequency spectrum corresponding to a Fourier transform of the gradient pulse polarity scheme of FIG. 10 applied to SSE diffusion gradients.

FIG. 11 shows a frequency spectrum 122 corresponding to a Fourier transform of the pulse polarity scheme 120 of FIG. 10 applied to SSE diffusion gradients. Frequency spectrum 122 shows calculated vibrational frequencies induced with an exemplary gradient coil assembly having SSE diffusion gradient pulses according to the pulse polarity scheme 120 applied thereto. Frequency spectrum 122 shows harmonic peaks 123 offset from 10 Hz.

Figure 12:
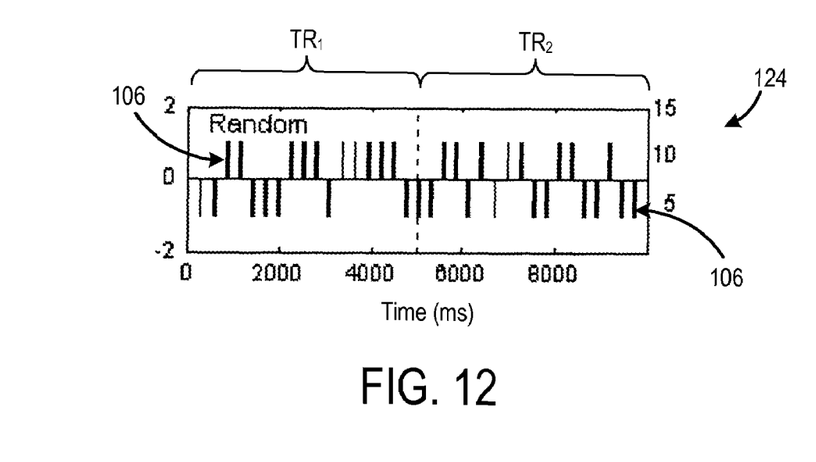
FIG. 12 is a gradient pulse polarity scheme for use in the technique of FIG. 3 in accordance with another aspect of the invention.

FIG. 12 shows a pulse polarity scheme 124 having the inversion sequence set to "Random". In the "Random" inversion sequence, the polarities of the polarity designators 106 are randomly inverted. In this manner, the polarities of the polarity designators 106 are not inverted according to a prescribed pattern. Rather, the polarity of each polarity designator 106 is randomly inverted. The "Random" inversion sequence may randomly invert the polarity designators 106 over the 2*TR interval as shown, or alternatively, the polarity designators 106 may be randomly inverted over an N*TR interval where the "Random" inversion sequence repeats as often as every N TR intervals or where the "Random" inversion sequence never repeats for an entire scan.

Figure 13:
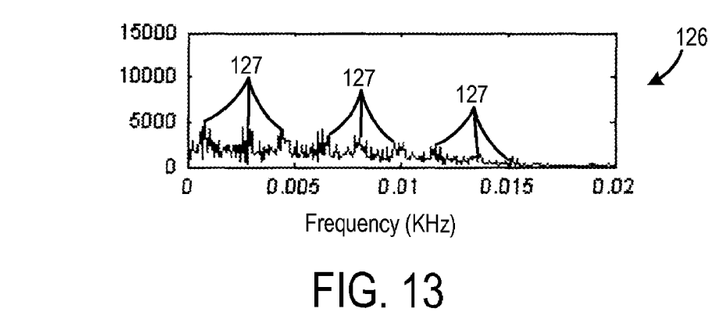
FIG. 13 is a frequency spectrum corresponding to a Fourier transform of the gradient pulse polarity scheme of FIG. 12 applied to SSE diffusion gradients.

FIG. 13 shows a frequency spectrum 126 corresponding to a Fourier transform of the pulse polarity scheme 124 of FIG. 12 applied to SSE diffusion gradients. Frequency spectrum 126 shows calculated vibrational frequencies induced with an exemplary gradient coil assembly having SSE diffusion gradient pulses according to the pulse polarity scheme 124 applied thereto. The calculated vibrational frequencies illustrate diminishing vibrational frequency peaks 127 from 0 Hz to 20 Hz.

The terms "None", "Blade", "Slice", "Slice and Blade", and "Random" of the pulse polarity schemes 108, 112, 116, 120, 124 above are exemplary terms that are intended to refer to the pulse polarity scheme labeled thereby for identification and are not intended to limit the pulse polarity schemes 108, 112, 116, 120, 124 to a particular form. As such, it is contemplated that other or additional nomenclature may be used to distinguish between various pulse polarity schemes.

Figure 14:
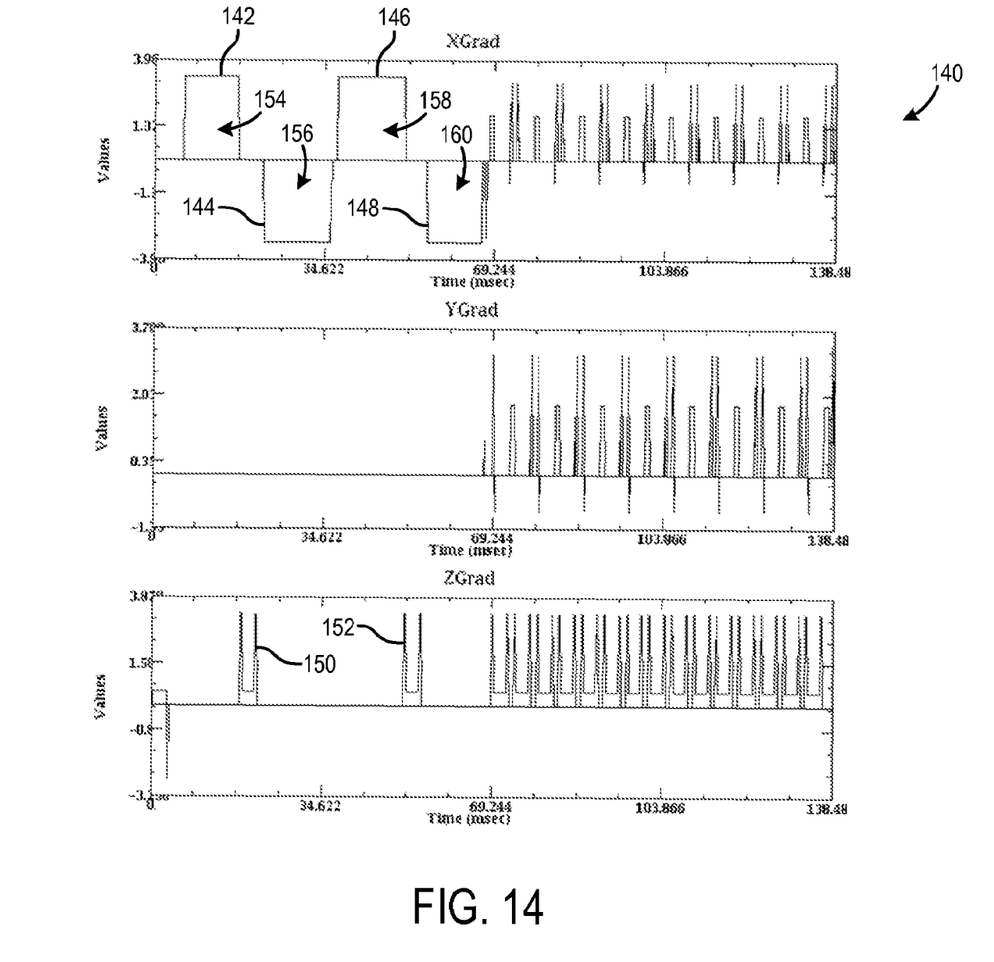
FIG. 14 is a portion of a Dual Spin Echo (DSE) DW-PROPELLER pulse sequence to acquire diffusion weighted MR images.

In addition to inverting the polarities of diffusion weighted pulses between blades or slices, the shape of the diffusion weighted pulses may be modified to include an inversion thereof. FIG. 14 shows a pulse sequence to acquire Dual Spin Echo (DSE) diffusion weighted MR images according to another embodiment of the present invention. Pulses 72, 74 of FIG. 2 may each be modified from a single pulse to a series of multiple pulses. As shown in FIG. 14, pulses 72, 74 are each modified in a diffusion gradient sequence 140 to include a pair of alternating polarity diffusion gradient pulses 142, 144 and 146, 148, respectively. It is contemplated, however, that pulses 72, 74 may each be modified to include more than two pulses. In a preferred embodiment, pulses 142, 144 are applied before and after a slice selective pulse 150, respectively, and pulses 146, 148 are applied before and after a slice selective pulse 152, respectively. As shown, diffusion gradient pulses 142, 144, 146, 148 are applied along an x axis for each image slice; however, it is contemplated that diffusion gradient pulses 142, 144, 146, 148 may be similarly applied along other axes, such as a y axis or a z axis. A gradient area sum of pulse areas 154, 156, 158, 160 is preferably substantially equal to zero to reduce low frequency vibrational content.

A ratio of widths of pulse 142 to pulse 144 may be varied to produce a desired frequency harmonic distribution. In a preferred embodiment, the ratio is varied between 0.0 and 1.0; however, it is contemplated that the ratio may be varied greater than 1.0. TE is reduced as the ratio changes from 0.0 to 0.5, and TE is increased as the ratio changes from 0.5 to 1.0. As TE becomes shorter, the signal-to-noise ratio (SNR) of the acquired data increases. Conversely, as TE becomes longer, the SNR of the acquired data decreases. Additionally, a height and shape of pulses 142, 144, 146, 148 may be independently modified to further tailor MR system vibration frequencies caused thereby. For example, the shape of pulses 142, 144, 146, 148 may be modified to a sinusoidal-type shape.

The polarities of pulses 142, 144, 146, 148 alternate between pulses. That is, the polarities of pulses 142, 146 are opposite that of pulses 144, 148. The pulse polarity schemes 108, 112, 116, 120, 124 may be applied to the DSE diffusion weighted pulses 142, 144, 146, 148 between slices and/or blades according to the invention as described above. However, the polarity of the polarity designators 106 corresponds to the polarity of pulses 142, 146 of diffusion gradient sequence 140, and the polarity of pulses 144, 148 is opposite that of pulses 142, 146. That is, if the polarity of the polarity marker 106 is positive, then the polarities of pulses 142, 144, 146, 148 are set to positive, negative, positive, and negative, respectively. If the polarity of the polarity marker 106 is negative, then the polarities of pulses 142, 144, 146, 148 are set to negative, positive, negative, and positive, respectively.

Figure 15:
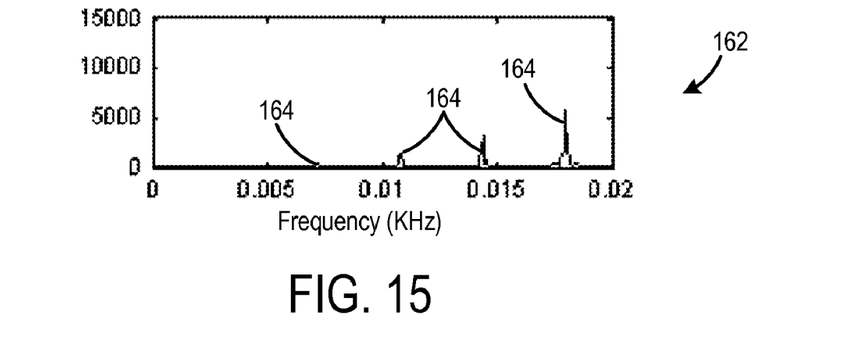
FIG. 15 is a frequency spectrum corresponding to a Fourier transform of the gradient pulse polarity scheme of FIG. 4 applied to DSE diffusion gradients.

FIG. 15 shows a frequency spectrum 162 corresponding to a Fourier transform of the pulse polarity scheme 108 of FIG. 4 applied to DSE diffusion gradients. Frequency spectrum 162 shows calculated vibrational frequencies induced with an exemplary gradient coil assembly having DSE diffusion gradient pulses according to the pulse polarity scheme 108 applied thereto. As shown, frequency spectrum 162 shows peak frequencies 164 offset from 10 Hz.

Figure 16:
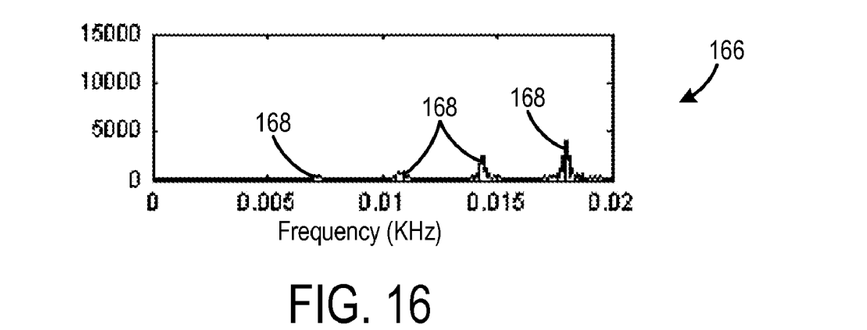
FIG. 16 is a frequency spectrum corresponding to a Fourier transform of the gradient pulse polarity scheme of FIG. 6 applied to DSE diffusion gradients.

FIG. 16 shows a frequency spectrum 166 corresponding to a Fourier transform of the pulse polarity scheme 112 of FIG. 6 applied to DSE diffusion gradients. Frequency spectrum 166 shows calculated vibrational frequencies induced with an exemplary gradient coil assembly having DSE diffusion gradient pulses according to the pulse polarity scheme 112 applied thereto. Frequency spectrum 166 shows harmonic peaks 168 inconsistent with 10 Hz.

Figure 17:
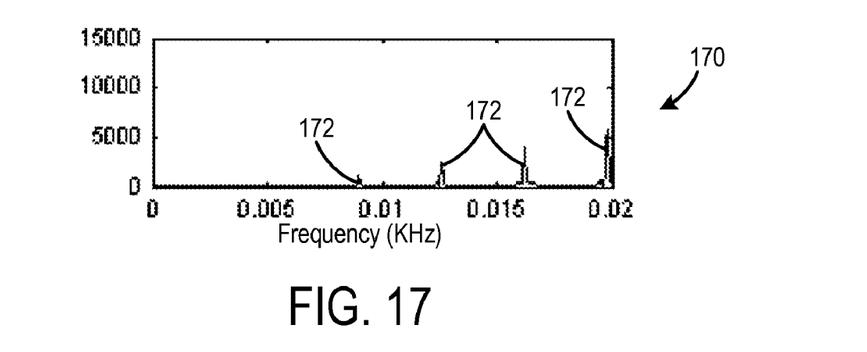
FIG. 17 is a frequency spectrum corresponding to a Fourier transform of the gradient pulse polarity scheme of FIG. 8 applied to DSE diffusion gradients.

FIG. 17 shows a frequency spectrum 170 corresponding to a Fourier transform of the pulse polarity scheme 116 of FIG. 8 applied to DSE diffusion gradients. Frequency spectrum 170 shows calculated vibrational frequencies induced with an exemplary gradient coil assembly having DSE diffusion gradient pulses according to the pulse polarity scheme 116 applied thereto. Peak frequencies 172 non-coincident with 10 Hz are illustrated.

Figure 18:
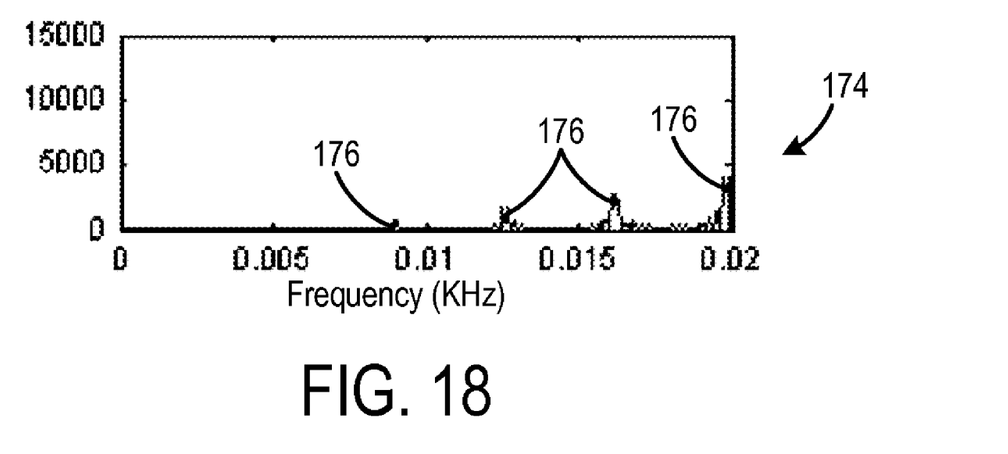
FIG. 18 is a frequency spectrum corresponding to a Fourier transform of the gradient pulse polarity scheme of FIG. 10 applied to DSE diffusion gradients.

FIG. 18 shows a frequency spectrum 174 corresponding to a Fourier transform of the pulse polarity scheme 120 of FIG. 10 applied to DSE diffusion gradients. Frequency spectrum 174 shows calculated vibrational frequencies induced with an exemplary gradient coil assembly having DSE diffusion gradient pulses according to the pulse polarity scheme 120 applied thereto. Frequency spectrum 174 shows harmonic peaks 176 offset from 10 Hz.

Figure 19:
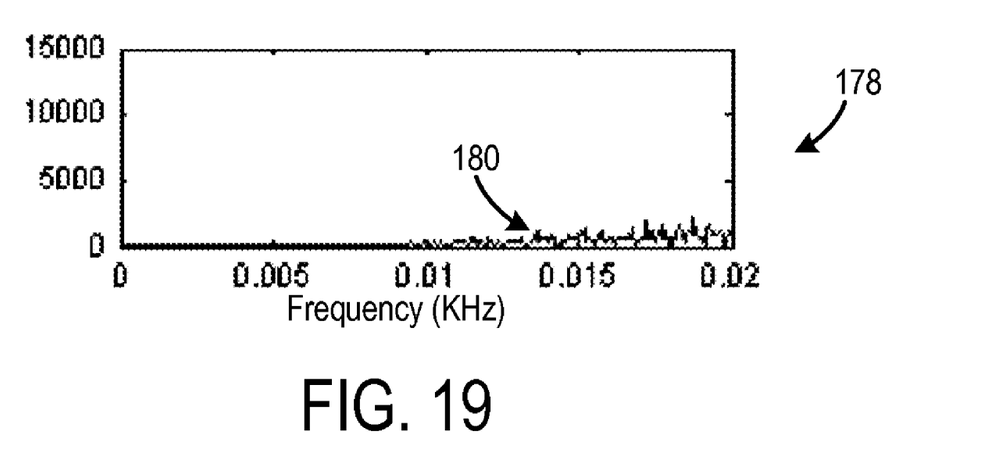
FIG. 19 is a frequency spectrum corresponding to a Fourier transform of the gradient pulse polarity scheme of FIG. 12 applied to DSE diffusion gradients.

FIG. 19 shows a frequency spectrum 178 corresponding to a Fourier transform of the pulse polarity scheme 124 of FIG. 12 applied to DSE diffusion gradients. Frequency spectrum 178 shows calculated vibrational frequencies induced with an exemplary gradient coil assembly having DSE diffusion gradient pulses according to the pulse polarity scheme 124 applied thereto. The calculated vibrational frequencies illustrate increasing 174 vibrational frequency peaks 180 from 0 Hz to 20 Hz.

Figure 20:
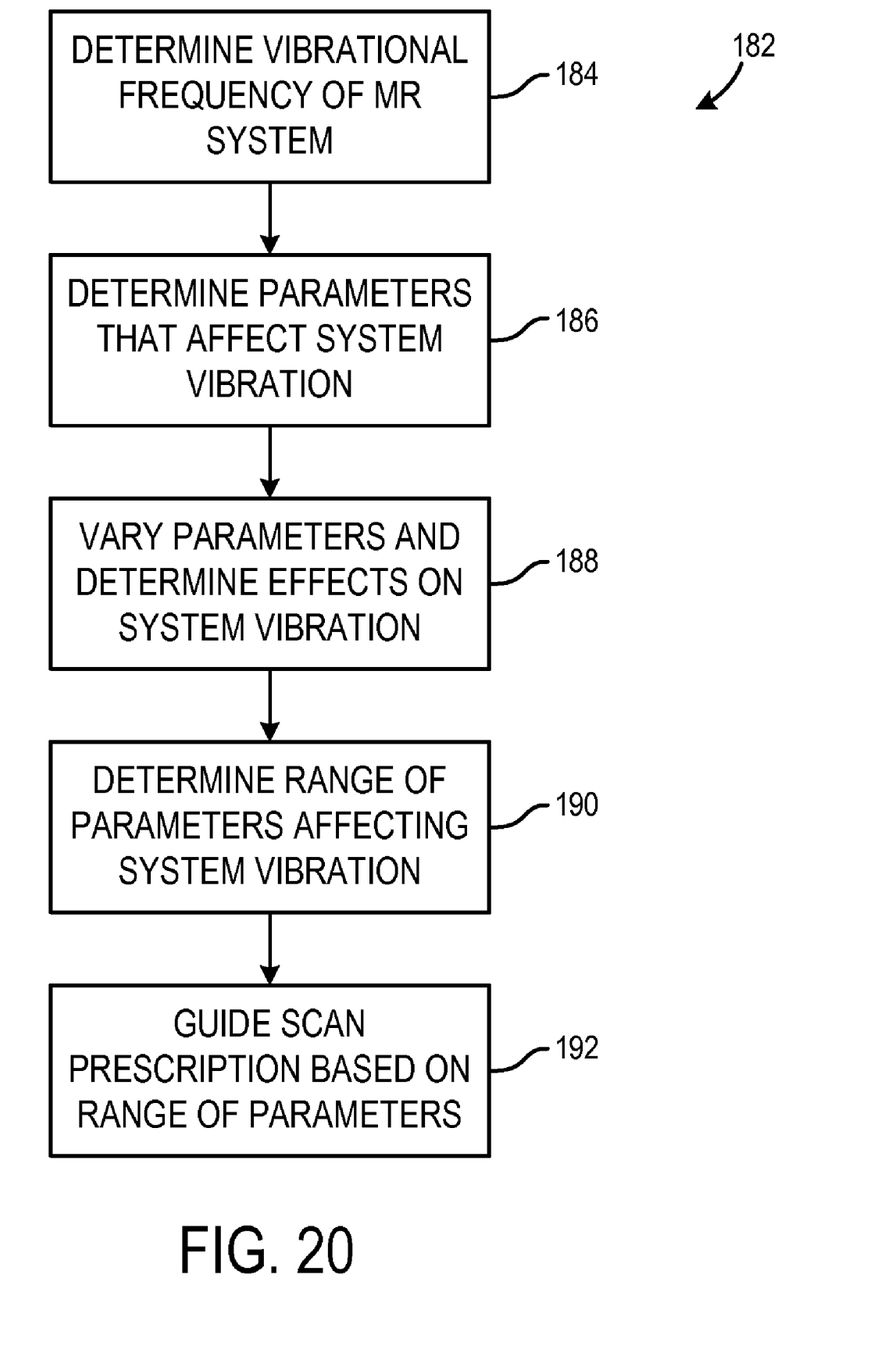
FIG. 20 is another technique for reducing vibration-related artifacts according to the present invention.

FIG. 20 shows another technique for reducing vibration-related artifacts according to the present invention. Technique 182 begins at step 184 by determining a mechanical vibrational frequency of an MR system prior to performing a scan. Next, a plurality of parameters is determined 186 that affects the mechanical resonant frequency of the MR system. The parameters may include the number of slices, the duration of TR, and echo train length (ETL); however, the parameters are not so limited. At step 188, the parameters are varied, and vibrational frequencies induced on the MR system for each parameter variation are calculated. A range of the parameters is determined that induces vibrational frequencies coincident with the vibrational frequency of the MR system at step 190. Parameters outside the range are then used to guide prescription of a diffusion weighted scan at step 192.

Figure 21:
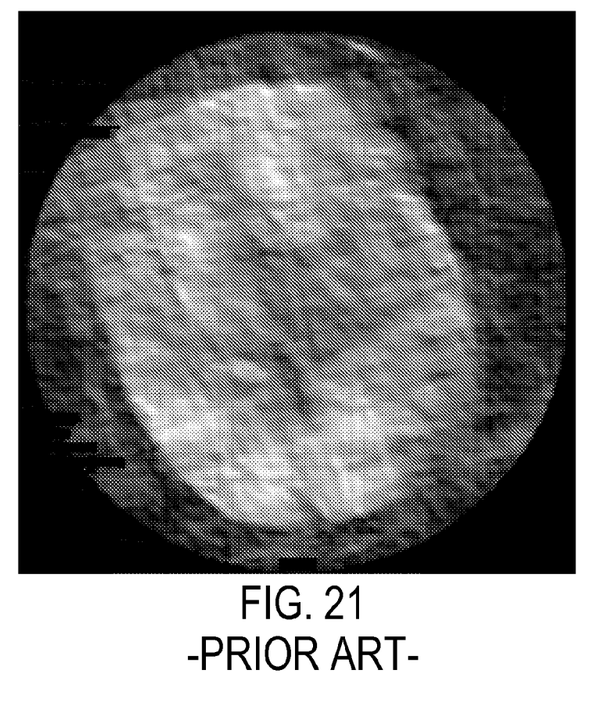
FIG. 21 is a reconstructed image acquired from a known diffusion weighted imaging technique.

FIG. 21 shows a DW-PROPELLER image reconstructed from MR data acquired with a known diffusion weighted imaging technique. The MR data was acquired with SSE diffusion gradients applied along the right-left direction. As shown, the image has significant ghosting and artifacts.

Figure 22:
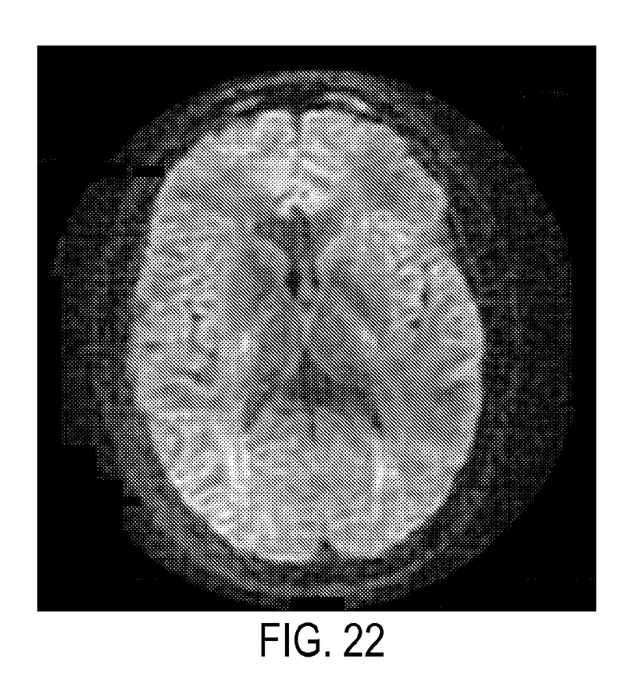
FIG. 22 is a reconstructed image from a diffusion weighted imaging technique according to the present invention.

FIG. 22 shows a DW-PROPELLER image reconstructed from MR data acquired using a technique according to the present invention. SSE diffusion gradients were applied along the right-left direction according to the "Blade and Slice" polarity scheme as described above. As shown, the reconstructed image shows reduced motion artifacts and ghosting compared with the image of FIG. 15.

The exemplary frequency spectra 110, 114, 118, 122, 126 may be used to determine a particular frequency spectrum having a vibrational frequency least coincident with an MR system vibrational frequency relative to the remaining frequency spectra. However, other factors related to the MR system, the gradient coil, and/or the diffusion weighted scan parameters may influence the selection of the desired pulse polarity scheme to be used in a given diffusion weighted MR scan. As such, the frequency spectrum having a vibrational frequency least coincident with an MR system vibrational frequency relative to the remaining frequency spectra may not be desirable for the diffusion weighted MR scan. In this regard, it is contemplated that the diffusion weighted scan may utilize a pulse polarity scheme of reduced vibrational frequency coincidence, but not necessarily the polarity scheme with the least coincidence.

Therefore, in accordance with one embodiment of the invention, an MR apparatus includes an MR system having a plurality of gradient coils positioned about a bore of a magnet to impress a polarizing magnetic field. An RF transceiver system and an RF switch are controlled by a pulse module to transmit and receive RF signals to and from an RF coil assembly to acquire MR images. The MR apparatus also includes a computer programmed to determine a mechanical resonant frequency of the MR system and acquire diffusion weighted MR data such that vibration harmonics generated during application of diffusion weighted gradients to acquire the diffusion weighted MR data do not coincide with the mechanical resonant frequency of the MR system.

In accordance with another embodiment, a method of MR imaging includes the step of determining a plurality of diffusion gradient pulse sequences, each diffusion gradient pulse sequence having a plurality of diffusion weighted gradient pulses. The method also includes the steps of modeling each of the plurality of diffusion gradient pulse sequences with a distinct gradient amplitude and polarity versus time function having a polarity marker for the plurality of diffusion weighted gradient pulses and generating a temporal frequency spectrum of vibrational forces induced with each of the modeled plurality of diffusion gradient pulse sequences. The method further includes selecting a modeled diffusion gradient pulse sequence from the plurality of modeled diffusion gradient pulse sequences having a temporal frequency spectrum dissimilar from a mechanical resonance frequency spectrum of an MR system and applying the selected modeled diffusion gradient pulse sequence in an MR scan.

In accordance with another embodiment of the invention, the invention is embodied in a computer program stored on a computer readable storage medium and having instructions which, when executed by a computer, cause the computer to determine a mechanical resonant vibration frequency of an MR apparatus and determine a series of diffusion gradient pulse polarity schemes for diffusion weighted gradients to be applied by gradient coils of the MR apparatus. A frequency spectrum is calculated of vibrational forces induced for each of the diffusion gradient pulse polarity schemes. The instructions further cause the computer to identify a frequency spectrum having at least one spectral peak at a frequency inconsistent with the mechanical vibration frequency of the MR apparatus and perform a diffusion weighted MR scan of an imaging subject with application of diffusion weighted gradients being governed by the diffusion gradient pulse polarity scheme corresponding to the identified frequency spectrum.

In accordance with yet another embodiment of the invention, a method of MR imaging includes the steps of measuring a mechanical resonant frequency of an MR scanner and determining a range of parameters whose corresponding pulse sequence has a gradient sequence that excites the mechanical resonant frequencies of the MR scanner during an MR scan. The use of the MR scanner is limited based on the determined range of parameters.

The present invention has been described in terms of the preferred embodiment, and it is recognized that equivalents, alternatives, and modifications, aside from those expressly stated, are possible and within the scope of the appending claims.

What is claimed is:

1. A method of magnetic resonance (MR) imaging comprising the steps of:
   determining a plurality of diffusion gradient pulse sequences, each diffusion gradient pulse sequence having a plurality of diffusion weighted gradient pulses;
   modeling each of the plurality of diffusion gradient pulse sequences with a distinct gradient amplitude and polarity versus time function having a polarity marker for the plurality of diffusion weighted gradient pulses;
   generating a temporal frequency spectrum of vibrational forces induced with each of the modeled plurality of diffusion gradient pulse sequences;
   selecting a modeled diffusion gradient pulse sequence from the plurality of modeled diffusion gradient pulse sequences having a temporal frequency spectrum dissimilar from a mechanical resonance frequency spectrum of an MR system; and
   applying the selected modeled diffusion gradient pulse sequence in an MR scan.

2. The method of claim 1 further comprising the step of assuming the mechanical resonance frequency spectrum of the MR system to be generic for a class of MR systems to which the MR system belongs.

3. The method of claim 1 further comprising the step of determining the mechanical resonance frequency spectrum from vibrational data collected with an accelerometer.

4. The method of claim 1 wherein the plurality of diffusion weighted gradient pulses includes Dual Spin Echo diffusion weighted gradient pulses.

5. The method of claim 1 wherein the step of modeling comprises modeling each of the plurality of diffusion gradient pulse sequences over a 2*TR interval, the 2*TR interval comprising a $TR_1$ interval followed by a $TR_2$ interval.

6. The method of claim 5 further comprising the step of determining one of the distinct gradient amplitude and polarity versus time functions by:
   setting the polarity of a first polarity marker in the $TR_1$ interval equal to one of a positive polarity and a negative polarity;
   setting polarities of the remaining polarity markers in the $TR_1$ interval equal to the polarity of the first polarity marker; and
   setting polarities of the polarity markers in the $TR_2$ interval equal to a polarity equal to that of the polarity markers in the $TR_1$ interval.

7. The method of claim 5 further comprising the step of determining one of the distinct gradient amplitude and polarity versus time functions by:
   setting the polarity of a first polarity marker in each of a first set of M TR intervals equal to one of a positive polarity and a negative polarity;
   setting polarities of the remaining polarity markers in the first set of M TR intervals equal to the polarity of the first polarity marker;
   setting polarities of the polarity markers in a second set of M TR intervals equal to a polarity opposite that of the polarity markers in the first set of M TR intervals; and
   wherein M is an integer greater than zero.

8. The method of claim 5 further comprising the step of determining one of the distinct gradient amplitude and polarity versus time functions by:
   setting the polarity of a first set of N polarity markers in the $TR_1$ interval equal to one of a positive polarity and a negative polarity;
   setting the polarity of each succeeding set of N polarity markers in the $TR_1$ interval equal to a polarity opposite that of the preceding set of N polarity markers;
   setting the polarity of a first set of N polarity markers in the $TR_2$ interval equal to the polarity of the first set of N polarity markers in the $TR_1$ interval;
   setting the polarity of each succeeding set of N polarity markers in the $TR_2$ interval equal to a polarity opposite that of the preceding set of N polarity markers; and
   wherein N is an integer greater than zero.

9. The method of claim 5 further comprising the step of determining one of the distinct gradient amplitude and polarity versus time functions by:
   setting the polarity of a first set of N polarity markers in the $TR_1$ interval equal to one of a positive polarity and a negative polarity;
   setting the polarity of each succeeding set of N polarity markers in the $TR_1$ interval equal to a polarity opposite that of the preceding set of N polarity markers;
   setting the polarity of a first set of N polarity markers in the $TR_2$ interval equal to a polarity opposite that of the first set of N polarity markers in the $TR_1$ interval;
   setting the polarity of each succeeding set of N polarity markers in the $TR_2$ interval equal to a polarity opposite that of the preceding set of N polarity markers; and
   wherein N is an integer greater than zero.

10. The method of claim 5 further comprising the step of determining one of the distinct gradient amplitude and polarity versus time functions by randomly setting the polarity of each polarity marker in the 2*TR interval equal to one of a positive polarity and a negative polarity.

11. The method of claim 1 wherein the step of selecting a modeled diffusion gradient pulse sequence comprises:
   determining a vibration frequency spectrum of the MR system;
   identifying harmonic peaks in the vibration frequency spectrum of the MR system;
   identifying harmonic peaks in the temporal frequency spectrum of each modeled diffusion gradient pulse sequence; and
   selecting a modeled diffusion gradient pulse sequence having a vibrational harmonic peak at a frequency different than a vibrational harmonic peak of the MR system.

12. The method of claim 1 wherein the step of applying the selected modeled diffusion gradient pulse sequence comprises applying the selected modeled diffusion gradient pulse sequence in one of a diffusion weighted periodically rotated overlapping parallel line with enhanced reconstruction (DW-PROPELLER) scan and a diffusion weighted echo planar imaging (DWEPI) scan.

13. A computer readable storage medium having a computer program stored thereon and representing a set of instructions that when executed by a computer causes the computer to:
   obtain a mechanical resonant vibration frequency of a magnetic resonance imaging (MR) apparatus;
   determine a series of diffusion gradient pulse polarity schemes for diffusion weighted gradients to be applied by gradient coils of the MR apparatus;

calculate a frequency spectrum of vibrational forces induced for each of the diffusion gradient pulse polarity schemes;

identify a frequency spectrum having at least one spectral peak at a frequency inconsistent with the mechanical vibration frequency of the MR apparatus; and perform a diffusion weighted MR scan of an imaging subject with application of diffusion weighted gradients being governed by the diffusion gradient pulse polarity scheme corresponding to the identified frequency spectrum.

14. The computer readable storage medium of claim 13 wherein the set of instructions further causes the computer to determine the series of diffusion gradient pulse polarity schemes for a specific MR apparatus after the MR apparatus has been delivered to a site location.

15. The computer readable storage medium of claim 13 wherein the set of instructions further causes the computer to determine the series of diffusion gradient pulse polarity schemes on a per-patient basis.

16. The computer readable storage medium of claim 13 wherein the set of instructions further causes the computer to perform the diffusion weighted MR scan with application of Dual Spin Echo diffusion weighted gradients.

17. The computer readable storage medium of claim 13 wherein the set of instructions further causes the computer to determine the series of diffusion gradient pulse polarity schemes by:
   determining a single-polarity diffusion gradient pulse polarity scheme; and
   determining at least one dual-polarity diffusion gradient pulse polarity scheme.

18. The computer readable storage medium of claim 17 wherein the set of instructions further causes the computer to determine the at least one dual-polarity diffusion gradient pulse polarity scheme by setting the polarity of each gradient pulse of the diffusion gradient pulse polarity scheme equal to one of a positive polarity and a negative polarity according to one of an every M blades polarity scheme, an every N slices polarity scheme, an every other slice and blade polarity scheme, and a random polarity scheme, where M is an integer representing a number of inverted blades in a blade inversion group and where N is an integer representing a number of inverted slices in a slice inversion group.

19. The computer readable storage medium of claim 13 wherein the set of instructions further causes the computer to determine the mechanical vibration frequency of the MR apparatus from a presumed mechanical vibration frequency value for the MR apparatus.

20. The computer readable storage medium of claim 13 wherein the set of instructions further causes the computer to automatically identify the frequency spectrum having a spectral peak at a frequency inconsistent with the mechanical vibration frequency of the MR apparatus.

21. An MR apparatus comprising:
   a magnetic resonance (MR) system having a plurality of gradient coils positioned about a bore of a magnet to impress a polarizing magnetic field and an RF transceiver system and an RF switch controlled by a pulse module to transmit RF signals to an RF coil assembly to acquire MR images; and
   a computer programmed to:
      obtain a mechanical resonant vibration frequency of the MR system;
      automatically determine scan parameters for a pulse sequence having diffusion weighted gradients such that vibration harmonics generated during application of the diffusion weighted gradients to acquire diffusion weighted MR data avoid the mechanical resonant vibration frequency of the MR system; and
      acquire diffusion weighted MR data of an imaging subject with application of the automatically determined scan parameters.

22. The MR apparatus of claim 21 wherein the computer is further programmed to cause application of the diffusion weighted gradients for each slice of a multi-slice acquisition, and wherein the computer is further programmed to invert the polarity of the diffusion weighted gradients between slice acquisitions.

23. The MR apparatus of claim 21 wherein the computer is further programmed to cause repeated application of the diffusion weighted gradients during acquisition of each blade of a multi-blade acquisition, and wherein the computer is further programmed to invert the polarity of the diffusion weighted gradients between blade acquisitions.

* * * * *